(12) United States Patent
Tsuji et al.

(10) Patent No.: US 9,525,087 B2
(45) Date of Patent: Dec. 20, 2016

(54) LIGHT RECEIVING DEVICE AND METHOD FOR MANUFACTURING LIGHT RECEIVING DEVICE

(71) Applicant: SUMITOMO ELECTRIC INDUSTRIES, LTD., Osaka (JP)

(72) Inventors: Yukihiro Tsuji, Kawasaki (JP); Hiroshi Inada, Sakai (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 52 days.

(21) Appl. No.: 14/690,128

(22) Filed: Apr. 17, 2015

(65) Prior Publication Data

US 2015/0311366 A1    Oct. 29, 2015

(30) Foreign Application Priority Data

Apr. 28, 2014    (JP) ................................ 2014-092655

(51) Int. Cl.
*H01L 31/0352*    (2006.01)
*H01L 31/0216*    (2014.01)
(Continued)

(52) U.S. Cl.
CPC . *H01L 31/035236* (2013.01); *H01L 31/02161* (2013.01); *H01L 31/105* (2013.01); *H01L 31/184* (2013.01); *Y02P 70/521* (2015.11)

(58) Field of Classification Search
None
See application file for complete search history.

(56) References Cited

U.S. PATENT DOCUMENTS

| 2012/0286328 A1 | 11/2012 | Nishida et al. | |
| 2013/0140598 A1* | 6/2013 | Hoppel | H01L 33/382 257/98 |
| 2014/0264270 A1* | 9/2014 | Dutta | H01L 27/14636 257/14 |

FOREIGN PATENT DOCUMENTS

WO    WO 2011-089949    7/2011

OTHER PUBLICATIONS

A. Gin et al., "Ammonium sulfide passivation of Type-II InAs/GaSb superlattice photodiodes", Applied Physics Letters, vol. 84, No. 12, pp. 2037-2039, Mar. 22, 2004.

* cited by examiner

*Primary Examiner* — Anthony Ho
*Assistant Examiner* — Kevin Quinto
(74) *Attorney, Agent, or Firm* — Smith, Gambrell & Russell, LLP.

(57) ABSTRACT

A light receiving device includes a mesa structure including a light absorption layer disposed on a semiconductor region; a passivation film disposed on a side surface of the mesa structure, the passivation film containing oxygen; and a nitriding layer disposed between the side surface of the mesa structure and the passivation film. The light absorption layer includes a super-lattice structure including first semiconductor layers and second semiconductor layers that are alternately stacked. The first semiconductor layer is made of a III-V group compound semiconductor. The second semiconductor layer is made of a III-V group compound semiconductor that is different from the III-V group compound semiconductor of the first semiconductor layer. The first semiconductor layer contains antimony as a group V constituent element. In addition, the nitriding layer is made of a nitride containing a group III constituent element of the (Continued)

first semiconductor layer and/or the second semiconductor layer.

9 Claims, 6 Drawing Sheets

(51) Int. Cl.
*H01L 31/105* (2006.01)
*H01L 31/18* (2006.01)

LIGHT RECEIVING DEVICE AND METHOD FOR MANUFACTURING LIGHT RECEIVING DEVICE

BACKGROUND OF THE INVENTION

1. Field of the Invention

The present invention relates to a light receiving device and a method for manufacturing a light receiving device.

2. Description of the Related Art

A compound semiconductor light receiving element array is disclosed in International Publication No. WO 2011/089949. A Type-II InAs/GaSb super-lattice structure is disclosed in A. Gin et. al., "Ammonium sulfide passivation of Type-II InAs/GaSb superlattice photodiodes", APPLIED PHYSICS LETTERS, VOLUME 84, NUMBER 12, pp. 2037-2039, 22 Mar., 2004.

A light receiving device including a light receiving layer composed of a III-V group compound semiconductor such as GaSb, containing antimony as a constituent element, exhibits sensitivity to, for example, light in a mid-infrared light region. The light receiving layer of the light receiving device has a super-lattice structure in which GaSb layers and InAs layers are alternately stacked, for example. This light receiving device (photodiode) is also utilized for an image sensor, for example. The image sensor includes a plurality of light receiving devices arranged in the shape of an array. This photodiode has, for example, a mesa structure. In order to form this mesa structure, an etching method such as a dry etching method or a wet etching method, is used. In production of the image sensor, a substrate product including a plurality of light receiving devices with the mesa structures is formed by this etching step. The plurality of mesa structures is device-isolated from each other by grooves in this etching step. After the etching step, a passivation film is formed on the mesa structure.

SUMMARY OF THE INVENTION

In order to form this passivation film, the substrate product is taken out of an etching apparatus and is transferred to a film deposition apparatus. In this case, the substrate product is exposed to the atmosphere. A dangling bond is formed at the interface between the side surface of the mesa structure of the photodiode and the passivation film formed on this side surface. The dangling bond captures electrons and, therefore, the above-described interface serves as a leakage path of a current. A leakage current flowing through this path is observed as a dark current in a light receiving device having sensitivity to the light having a mid-infrared wavelength, for example.

A light receiving device according to an aspect of the present invention includes a mesa structure including a light absorption layer disposed on a semiconductor region; a passivation film disposed on a side surface of the mesa structure, the passivation film containing oxygen; and a nitriding layer disposed between the side surface of the mesa structure and the passivation film. The light absorption layer includes a super-lattice structure including first semiconductor layers and second semiconductor layers that are alternately stacked. The first semiconductor layer is made of a III-V group compound semiconductor. The second semiconductor layer is made of a III-V group compound semiconductor that is different from the III-V group compound semiconductor of the first semiconductor layer. The first semiconductor layer contains antimony as a group V constituent element. In addition, the nitriding layer is made of a nitride containing a group III constituent element of the first semiconductor layer and/or the second semiconductor layer.

A method for manufacturing a light receiving device according to another aspect of the present invention includes the steps of growing a stacked semiconductor layer including a light absorption layer on a substrate, the light absorption layer including first semiconductor layers and second semiconductor layers stacked alternately; etching the stacked semiconductor layer to form a substrate product having a semiconductor mesa on the substrate; nitriding the stacked semiconductor layer exposed at a side surface of the semiconductor mesa by irradiating a nitrogen plasma to form a nitriding layer on the side surface of the semiconductor mesa; and forming a passivation film containing oxygen on the nitriding layer. The first semiconductor layer is made of a III-V group compound semiconductor. The second semiconductor layer is made of a III-V group compound semiconductor that is different from the III-V group compound semiconductor of the first semiconductor layer. In addition, the first semiconductor layer contains antimony as a group V constituent element.

DESCRIPTION OF THE PREFERRED EMBODIMENTS

Figure 1:
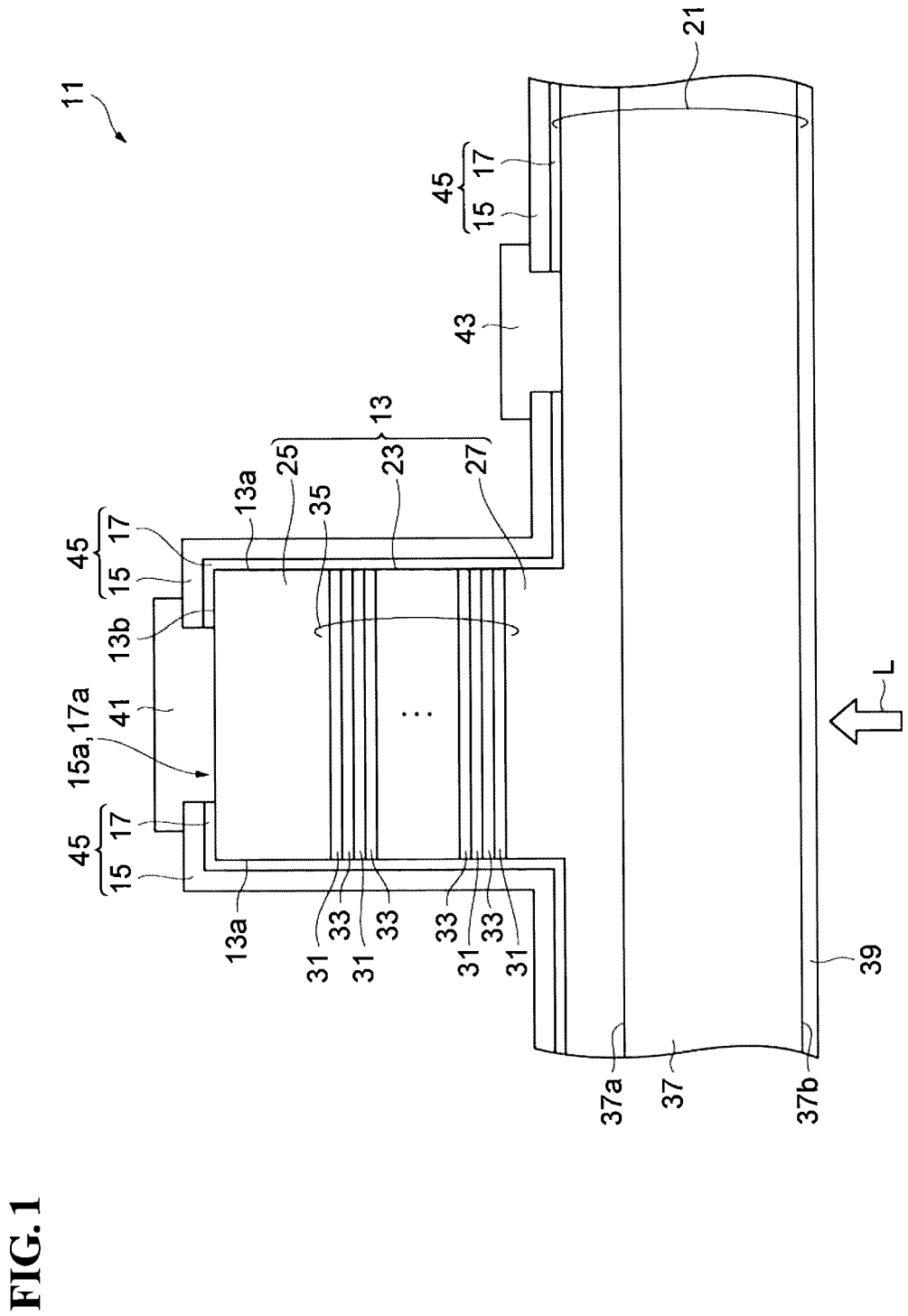
FIG. 1 is a schematic diagram showing the structure of a light receiving device according to the present embodiment.

Some specific embodiments will be described.

A light receiving device according to an embodiment includes (a) a mesa structure including a light absorption layer disposed on a semiconductor region; (b) a passivation film disposed on a side surface of the mesa structure, the passivation film containing oxygen; and (c) a nitriding layer disposed between the side surface of the mesa structure and the passivation film. The light absorption layer includes a super-lattice structure including first semiconductor layers and second semiconductor layers that are alternately stacked. The first semiconductor layer is made of a III-V group compound semiconductor. The second semiconductor layer is made of a III-V group compound semiconductor that is different from the III-V group compound semiconductor of the first semiconductor layer. The first semiconductor layer contains antimony as a group V constituent element. In addition, the nitriding layer is made of a nitride containing a group III constituent element of the first semiconductor layer and/or the second semiconductor layer.

According to this light receiving device, the nitriding layer is disposed between the passivation film containing oxygen and the side surface of the mesa structure. The nitriding layer is made of a nitride containing a group III constituent element of the first semiconductor layer and/or the second semiconductor layer constituting the super-lattice structure in the light absorption layer. Antimony that is contained in the first semiconductor layer as a group V constituent element is oxidized easily. However, the nitriding layer prevents the first semiconductor layer and the second semiconductor layer from being in contact with the passivation film containing oxygen. As a result, the leakage current of the light receiving device is reduced by forming the nitriding layer.

In the light receiving device according to an embodiment, preferably, the passivation film includes a silicon base inorganic insulator. In addition, the silicon base inorganic insulator of the passivation film may include silicon oxide or silicon oxynitride.

In the light receiving device according to an embodiment, preferably, the semiconductor region includes a substrate made of a III-V group compound semiconductor. The substrate has a principal surface and a back surface opposite to the principal surface. The mesa structure is disposed on the principal surface of the substrate. In addition, the light absorption layer of the mesa structure is configured to receive the light incident through the back surface of the substrate. The light receiving device may further include an electrode disposed on an upper surface of the mesa structure. The nitriding layer and the passivation film disposed on the side surface of the mesa structure may cover the upper surface of the mesa structure. Each of the nitriding layer and the passivation film preferably has an opening on the upper surface of the mesa structure. The electrode is in contact with the upper surface of the mesa structure through the openings in the nitriding layer and the passivation film.

In the light receiving device according to an embodiment, preferably, the super-lattice structure contains a GaSb/InAs super-lattice structure or GaAsSb/GaInAs super-lattice structure. The nitride of the nitriding layer contains gallium and/or indium as a group III constituent element.

A method for manufacturing a light receiving device according to an embodiment includes the steps of (a) growing a stacked semiconductor layer including a light absorption layer on a substrate, the light absorption layer including first semiconductor layers and second semiconductor layers stacked alternately; (b) etching the stacked semiconductor layer to form a substrate product having a semiconductor mesa on the substrate; (c) nitriding the stacked semiconductor layer exposed at a side surface of the semiconductor mesa by irradiating a nitrogen plasma to form a nitriding layer on the side surface of the semiconductor mesa; and (d) forming a passivation film containing oxygen on the nitriding layer. The first semiconductor layer is made of a III-V group compound semiconductor. The second semiconductor layer is made of a III-V group compound semiconductor that is different from the III-V group compound semiconductor of the first semiconductor layer. In addition, the first semiconductor layer contains antimony as a group V constituent element.

In the method for manufacturing a light receiving device according to an embodiment, preferably, after etching the stacked semiconductor layer, the substrate product is exposed to atmosphere. The step of nitriding the stacked semiconductor layer is performed in a film deposition apparatus. In addition, after the step of nitriding the stacked semiconductor layer, the passivation film is continuously formed in the film deposition apparatus.

The method for manufacturing a light receiving device according to an embodiment may further include a step of etching the substrate product by using a wet etching method, after etching the stacked semiconductor layer. In the step of etching the stacked semiconductor layer, the stacked semiconductor layer is etched by using a dry etching method so as to form a damaged region on the side surface of the semiconductor mesa. In the step of etching the substrate product by using the wet etching method, the damaged region is removed.

The findings of the present invention will be understood easily in consideration of the following detailed description with reference to the attached drawings shown as examples. The embodiments related to the light receiving device and the method for manufacturing the light receiving device will be described below with reference to the attached drawings. The same portions are indicated by the same reference numerals, where possible.

FIG. 1 is a schematic diagram showing the structure of a light receiving device according to the present embodiment. A light receiving device 11 is provided with a mesa structure 13, a passivation film 15, and a nitriding layer 17. The mesa structure 13 includes a light absorption layer 23 disposed on a semiconductor region 21. The mesa structure 13 includes a first conductivity type semiconductor region 25 and a second conductivity type semiconductor region 27. The light absorption layer 23 is disposed between the first conductivity type semiconductor region 25 and the second conductivity type semiconductor region 27. The passivation film 15 is disposed on the side surface 13a of the mesa structure 13. The nitriding layer 17 is disposed between the side surface 13a of the mesa structure 13 and the passivation film 15. The light absorption layer 23 includes a super-lattice structure 35 in which first semiconductor layers 31 and second semiconductor layers 33 are stacked alternately. The first semiconductor layer 31 is made of a first III-V group compound semiconductor. The second semiconductor layer 33 is made of a second III-V group compound semiconductor. For example, the first III-V group compound semiconductor contains antimony as a constituent element. The second III-V group compound semiconductor is made of a material different from the first III-V group compound semiconductor. The passivation film 15 is made of an inorganic material containing oxygen as a constituent element, specifically an oxide, e.g., silicon oxide ($SiO_2$).

According to this light receiving device 11, the nitriding layer 17 is disposed between the passivation film 15 containing oxygen as a constituent element and the side surface 13a of the mesa structure 13. At the side surface 13a of the mesa structure 13, the first semiconductor layer 31 and the second semiconductor layer 33 in the super-lattice structure 35 are exposed and covered with the nitriding layer 17. The nitriding layer 17 is made of a nitride containing a group III constituent element of the first semiconductor layer 31 and/or the second semiconductor layer 33. The light absorption layer includes a semiconductor layer (first semiconductor layer 31) containing antimony as a group V constituent element. An antimony element has a property of being oxidized easily. However, the first semiconductor layer 31 and the second semiconductor layer 33 are isolated from the passivation film 15 containing oxygen by forming the nitriding layer 17 therebetween. Accordingly, the nitriding layer 17 prevents the first semiconductor layer 31 and the second semiconductor layer 33 from being in contact with the passivation film 15 containing oxygen.

Examples of the structures of the light receiving device 11 are as described below.
First conductivity type semiconductor region 25: p-type GaSb
Second conductivity type semiconductor region 27: n-type GaSb
FIG. 1 shows the stacked structure having an n-i-p structure from the substrate side.
However, a p-type semiconductor substrate may be used. When the p-type semiconductor substrate is used, a p-i-n stacked structure from the substrate side is employed. For example, a non-doped GaSb substrate is used as the p-type semiconductor substrate.
Light absorption layer 23: super-lattice structure 35
First semiconductor layer 31: GaSb
Second semiconductor layer 33: InAs
Passivation film: $SiO_2$ The nitriding layer 17 is made of a compound containing a constituent element of a base semiconductor of a photodiode and nitrogen. Examples of the compound include group III nitrides such as GaN and InN, depending on the constituent element of the base semiconductor. The thickness of the nitriding layer 17 is, for example, 1 to 2 nm. A method for forming the nitriding layer 17 will be described below. In formation of the nitriding layer 17, a raw material for nitrogen and a raw material for another element to form a compound with nitrogen are not fed into a film deposition apparatus simultaneously. Initially, a substrate product having a mesa structure including a stacked semiconductor layer is placed in a chamber of a plasma film deposition apparatus such as a plasma chemical vapor deposition (CVD) apparatus. Thereafter, the raw material for nitrogen (for example, nitrogen gas or ammonia gas) is fed into the chamber of the plasma film deposition apparatus. A surface of the mesa structure is treated with nitrogen plasma and, thereby, a nitride containing a constituent element of the stacked semiconductor layer is formed on the surface of the stacked semiconductor layer of the substrate product. As a result of the nitrogen plasma treatment, the surface of the stacked semiconductor layer is nitrided and, thereby, the nitride containing the constituent element of the stacked semiconductor layer covers the semiconductor region.

The super-lattice structure 35 of the light absorption layer 23 is not limited to a GaSb/InAs super-lattice. A GaAsSb/GaInAs super-lattice may be used. The above-described structure is applied to semiconductor layers, such as, semiconductor super-lattice containing antimony as a group V constituent element.

The passivation film 15 includes, for example, a silicon base inorganic insulator. Examples of silicon base inorganic insulators may include not only silicon oxide ($SiO_2$) but also silicon oxynitride (SiON) and the like, if necessary. The passivation film 15 disposed on the nitriding layer 17 is not limited to a single layer and may include at least one layer that effectively makes the semiconductor surface into a nonconductor. According to this light receiving device 11, the silicon base inorganic insulator is applied to the passivation film 15 containing oxygen as a constituent element. The thickness of the passivation film 15 is, for example, 300 to 500 nm.

In the light receiving device 11, the semiconductor region 21 includes a substrate 37. The substrate 37 is made of, for example, a III-V group compound semiconductor. The substrate 37 has a principal surface 37a and a back surface 37b. The stacked semiconductor layer is grown on the principal surface 37a of the substrate 37 (refer to FIG. 2A). The substrate 37 is made of, for example, GaSb, InP, InAs, or InSb.

The mesa structure 13 is disposed on the principal surface 37a of the substrate 37. In one example, the light absorption layer 23 in the mesa structure 13 receives the light L incident through the back surface of the substrate 37. This structure is referred to as a back-illuminated type photodiode. If necessary, an antireflection (AR) film 39 is disposed on the back surface 37b of the substrate 37.

The nitriding layer 17 and the passivation film 15 are formed on the side surface 13a of the mesa structure 13 and on the upper surface 13b of the mesa structure 13. The light receiving device 11 is provided with an anode electrode and a cathode electrode. An electrode 41, which is any one of the anode electrode and the cathode electrode, is disposed on the upper surface 13b of the mesa structure 13 of the light receiving device 11. This electrode 41 is in contact with the upper surface 13b of the mesa structure 13 through an opening 17a in the nitriding layer 17 and an opening 15a in the passivation film 15. An electrode 43, which is the other one of the anode electrode and the cathode electrode, is disposed on the principal surface 37a of the substrate 37 in a portion outside the array of the mesa structure 13 or is disposed on the back surface 37b of the substrate 37. According to this light receiving device 11 including the back-illuminated type photodiodes, the side surface of the mesa structure 13 is covered with a multilayer structure 45 including the nitriding layer 17 and the passivation film 15.

Embodiments

Figure 2A:
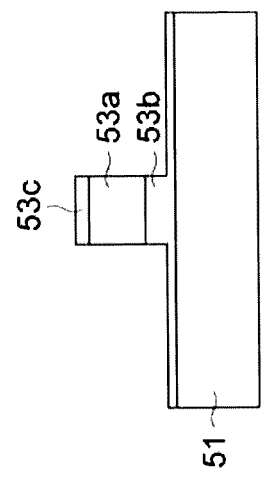
FIGS. 2A to 2F are schematic diagrams showing steps in a method for manufacturing a light receiving device, according to the present embodiment.

Production process of a mesa type image sensor will be described with reference to FIGS. 2A to 2F. A substrate for growth is prepared. The substrate 51 is made of, for example, GaSb doped with n-type dopant. The substrate 51 may be made of InAs or InP. In the present embodiment, as shown in FIG. 2A, a stacked semiconductor layer 53 is formed on the n-type GaSb substrate 51. The stacked semiconductor layer 53 includes a super-lattice structure to constitute a light absorption layer 53a, an n-type semiconductor layer 53b and a p-type semiconductor layer 53c. The light absorption layer 53a is disposed between the n-type semiconductor layer 53b and the p-type semiconductor layer 53c. In order to form a super-lattice structure, GaSb layers and InAs layers are stacked alternately. For example, a molecular beam epitaxy (MBE) method or a metal-organic vapor phase epitaxy (MOVPE) method is applied to formation of this stacked semiconductor layer 53. The thickness of the semiconductor layer (each of the GaSb layer and the InAs layer) constituting the super-lattice structure is, for example, within the range of 1 nm to 10 nm. Repetition of the semiconductor layers constituting the super-lattice structure is, for example, 100 to 500 layers. For example, n-type semiconductor layer 53b is made of n-type GaSb. The thickness of the semiconductor layer 53b is about 500 nm. The p-type semiconductor layer 53c is made of p-type GaSb. The thickness of the p-type semiconductor layer 53c is about 50 nm.

Figure 2B:
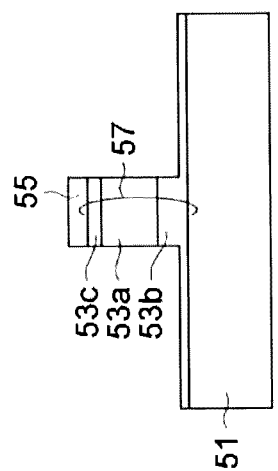

Subsequently, a silicon nitride film is formed on the stacked semiconductor layer. As shown in FIG. 2B, an insulating layer mask 55 is formed by transferring a pattern to define a mesa shape to the resulting silicon nitride film. In the present embodiment, the insulating layer mask 55 made of silicon nitride is formed by using dry etching. The stacked semiconductor layer 53 is etched by using the insulating layer mask 55. By this etching, a semiconductor mesa 57 and an isolation groove are formed. The isolation grooves define the individual semiconductor mesas 57. The depth of the isolation groove is within the range of 1 µm to 5 µm. In the present embodiment, the depth of the isolation groove is set to be 3 µm. The semiconductor layers included in the super-lattice structure are etched by using a wet etching method with a citric acid base etchant. Alternatively, a dry etching method with a halogen base gas or a mixed gas of methane and hydrogen as an etching gas may be applied for the etching of the semiconductor layers in the super-lattice structure. It is desirable that an inductively coupled plasma (ICP) reactive ion etching (RIE) apparatus be used for this dry etching.

Figure 2C:
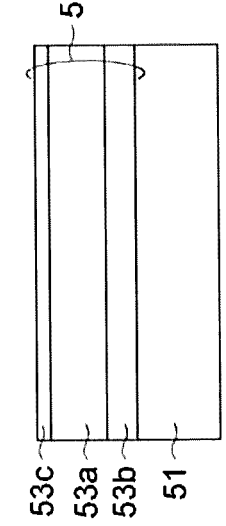

After the semiconductor mesa 57 is formed, as shown in FIG. 2C, the insulating layer mask 55 is removed by using buffered hydrofluoric acid. The substrate product is then transferred to the film deposition apparatus to form a passivation film. Before transferring the substrate product into the film deposition apparatus, the substrate product is brought into contact with the air containing oxygen. Therefore, a compound (oxide) of the constituent element of the semiconductor in the semiconductor mesa 57 and oxygen is formed as a natural oxide film on the surface of the semiconductor mesa 57 of the substrate product.

The surface of the substrate product exposed to the air is etched to remove a damaged region formed in the dry etching process by using a wet etching method. In this wet etching to remove the damaged region, a mixed solution of phosphoric acid, hydrogen peroxide, and water is used as an etchant. An example of the mixing ratio of this mixed solution is phosphoric acid/hydrogen peroxide/water of 12/25/250 (volume ratio). The GaSb/InAs super-lattice structure is etched with this etchant. In the wet etching, the amount of the etching of the semiconductor layer to remove the damaged region is, for example, in the range of 5 nm to 10 nm.

Figure 2D:
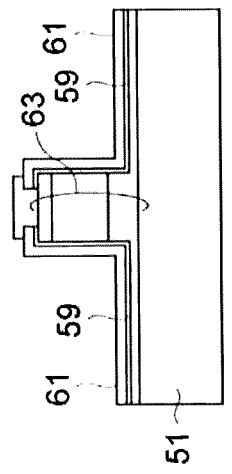

After this etching, as shown in FIG. 2D, the substrate product is placed in a plasma chemical vapor deposition (CVD) apparatus. Subsequently, nitrogen ($N_2$) is introduced into the plasma chemical vapor deposition (CVD) apparatus and plasma discharge is induced.

Example of the condition of plasma discharge will be described below.
Pressure in chamber: 0.4 Torr
Output of high frequency power supply: 20 W (frequency 13.56 MHz)
Susceptor (substrate) temperature: 150° C.
Plasma treatment time: 30 sec
Nitrogen flow rate: 200 sccm (in SI, this value is a flow rate of 200 $cm^3$ per minute in the state converted to 1,013 hPa and 0° C.)
A nitrogen gas or an ammonia gas is used as the nitrogen source, for example. The semiconductor containing Sb and/or Ga as a constituent element is placed in nitrogen plasma containing activated nitrogen (for example, nitrogen ion and/or nitrogen radical). Consequently, activated nitrogen in the plasma reacts with a constituent element (for example, a group III element) of the semiconductor so as to form a nitride on the surface of the semiconductor. As a result, a nitriding layer 59 is formed on the surface of the substrate product.

Furthermore, in this nitrogen plasma treatment, it is found that the side surface of the semiconductor super-lattice structure is planarized. As described later, after the dry etching process to form the semiconductor mesa 57, an amorphous layer is formed on the surface of the side surface of the semiconductor super-lattice structure. In addition, the amorphous layer has a portion having a recess and projection corresponding to the GaSb layer and InAs layer in the super-lattice structure at the surface thereof. By the nitrogen plasma treatment, the surface of the amorphous layer on the side surface of the semiconductor super-lattice structure is planarized. It is considered that this planarization is caused by collision of ions to the semiconductor layer. In the present embodiment, the thickness of the nitriding layer 59 is preferably 1 nm or more, and implantation of oxygen ions and oxygen radicals into the semiconductor layer is suppressed by the semiconductor layer 59 having this thickness. The thickness of the nitriding layer is preferably 5 nm or less. Plasma damage from nitrogen ions and nitrogen radicals is thereby reduced.

Figure 2E:
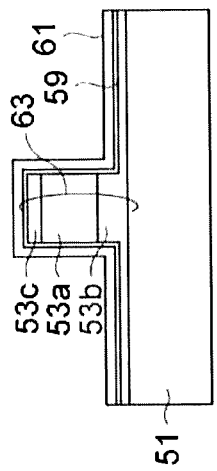

Subsequently as shown in FIG. 2E, a passivation film 61 is formed without breaking the vacuum of the plasma chemical vapor deposition (CVD) apparatus. In the present embodiment, a silicon base inorganic insulating layer is formed as the passivation film 61. More specifically, a silicon dioxide film serving as the passivation film 61 is continuously formed in the identical plasma CVD apparatus with the manufacturing conditions changed after the nitrogen plasma treatment. For example, a gas introduced into the plasma CVD apparatus is changed from nitrogen ($N_2$) gas to a process gas to form the passivation film 61. The passivation film 61 has a thickness of, for example, 300 nm to 500 nm. In the present embodiment, the thickness of the passivation film 61 is 300 nm. In order to form the silicon dioxide film as the passivation film 61, the process gas containing silane ($SiH_4$) and nitrous oxide is fed to the plasma CVD apparatus. A capacitively-coupled plasma CVD apparatus may be used for forming this silicon dioxide film. Alternatively, a microwave plasma CVD apparatus may be applied. As an oxidizing agent, nitrous oxide may be used. As a silicon source, silane or disilane may be used. The film deposition conditions for forming the passivation film 61 will be described below. Nitrous oxide flow rate: 100 sccm (in SI, this value is a flow rate of 100 $cm^3$ per minute in the state converted to 1,013 hPa and 0° C.)
Silane flow rate: 2 sccm (in SI, this value is a flow rate of 2 $cm^3$ per minute in the state converted to 1,013 hPa and 0° C.)
Pressure in chamber: 1.7 Torr
Output of high frequency power supply: 20 W
Susceptor (substrate) temperature: 150° C.
The nitriding layer formed in advance functions as a barrier to oxygen supplied from the oxidizing agent. As a result, further proceeding of oxidation of the semiconductor from the surface is avoided. The nitriding layer prevents a natural oxide (group III oxide) formed in the semiconductor surface from being in contact with a compound containing silicon and oxygen as constituent elements. In addition, the nitriding layer prevents a base semiconductor from being in contact with the compound containing silicon and oxygen.

Figure 2F:
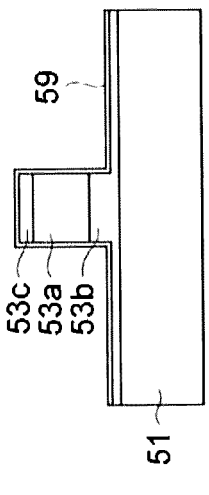

After forming the passivation film 61, as shown in FIG. 2F, an opening reaching the upper surface 63a of the mesa structure 63 is formed in the nitriding layer 59 and the passivation film 61. In the present embodiment, the silicon dioxide film and the nitriding layer are partly removed by using photolithography and dry etching. Consequently, the opening for forming an electrode is formed in each of the silicon dioxide film and the nitriding layer. Other opening is also formed in the bottom of a groove adjacent to the mesa structure to expose a surface of the n-type GaSb layer by etching the silicon dioxide film and the nitriding layer. Thereafter, electrodes are formed in each of the openings by using a lift-off method. One electrode is formed on the upper surface of the mesa structure through the opening. This electrode on the upper surface of the mesa structure is formed of a multilayer structure of Ti/Pt/Au/Ni/Au. The other electrode is disposed on the n-type GaSb layer at the bottom of the groove adjacent to the mesa structure through the other opening. The other electrode disposed on the n-type GaSb layer is formed of a multilayer structure of Ti/Pt/Au/Ni/Au.

If necessary, the back surface of the GaSb substrate is polished until the thickness of the GaSb substrate reaches about 100 μm. By reducing the thickness of the GaSb substrate, absorption of the incident light through the substrate is reduced.

In the embodiment, the image sensor (light receiving device) having a cutoff wavelength of 6 μm has a dark current density of $6 \times 10^{-5}$ A/cm$^2$. The cutoff wavelength refers to a maximum detection wavelength detectable by the light receiving device. On the other hand, the image sensor having a cutoff wavelength of 6 μm that is produced by a process flow without forming a nitriding layer has a dark current density of $6 \times 10^{-4}$ A/cm$^2$. Thus, the leakage current is reduced by forming the nitriding layer.

In the above-described embodiment, the GaSb layer and the InAs layer are alternately stacked on the substrate to form the super-lattice structure. The super-lattice structure may be constituted by GaAsSb layers and InGaAs layers that are alternately stacked.

After forming a plurality of photodiode arrays in the substrate product, an indium (In) bump is formed on each of the electrodes by the lift-off method. The photodiode array chip is divided from the substrate product by dicing. The photodiode array chip is connected to a silicon integrated circuit (IC) device including a read-out circuit through the bump by a flip-chip bonding method. A resin serving as underfill is filled into a gap between the silicon IC device and the photodiode array chip. Thereafter, a resin body is formed by heating and curing the underfill.

As is understood from the following explanation, in the image sensor (light receiving device) having sensitivity in the mid-infrared wavelength region, the structure of the passivation film is important for reducing a dark current.

Figure 3A:
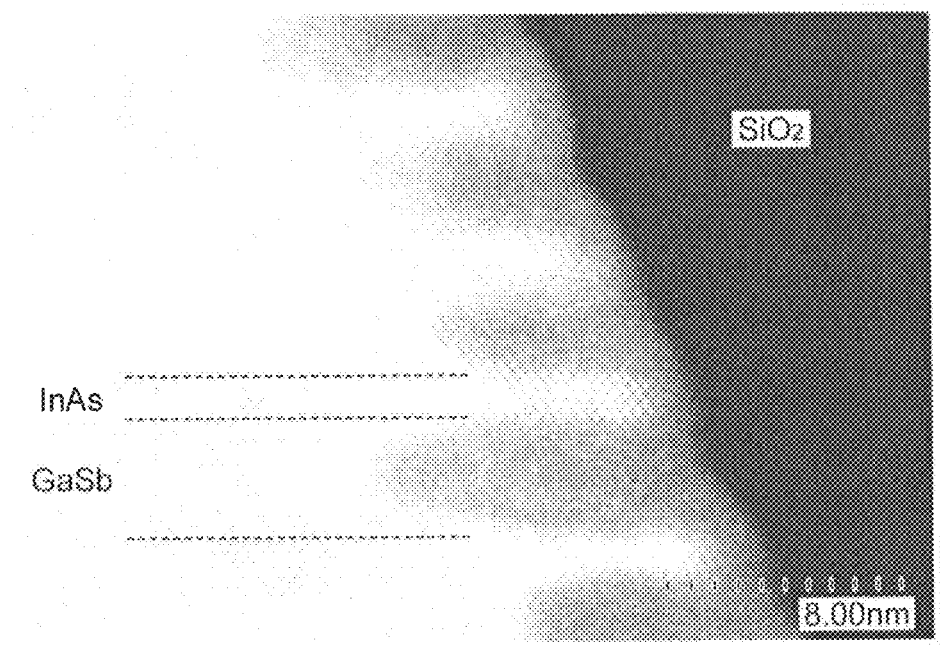
FIGS. 3A and 3B are diagrams showing scanning transmission electron microscope images in the vicinity of an interface between a super-lattice structure in a light absorption layer and a silicon dioxide film.
Figure 3B:
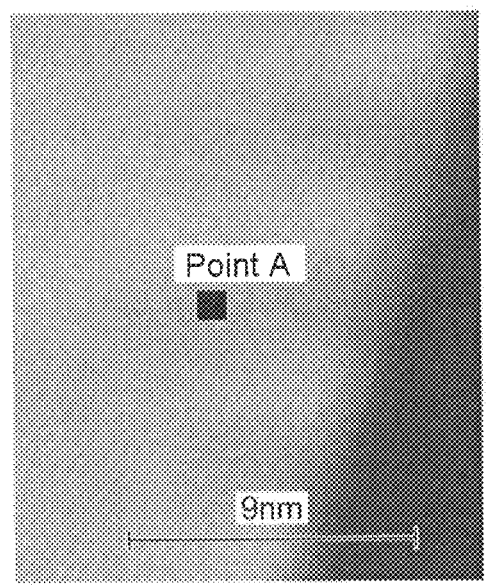

FIGS. 3A and 3B show scanning transmission electron microscope (STEM) images in the vicinity of an interface between the super-lattice structure and the silicon dioxide film for the image sensor without a nitriding layer between the super-lattice structure and the silicon dioxide film. Referring to FIG. 3A, in the left area of the drawing, the super-lattice structure including InAs layers and GaSb layers is shown as a white background in contrast. In the right area of the drawing, the silicon dioxide layer is shown as a black background in contrast. In the central area of the drawing where the silicon dioxide layer is in contact with the super-lattice structure, an amorphous layer containing constituent elements (Ga, In, As, Sb) of the InAs layer and the GaSb layer is indicated by gray. In the STEM image, the GaSb layer is recessed relative to adjacent InAs layers from the interface between the super-lattice structure and the silicon dioxide film toward the inside of the super-lattice structure. Recess portions and protruded portions are formed at the interface between the super-lattice structure and the silicon dioxide film. Therefore, the interface between the super-lattice structure and the silicon dioxide film is not flat. In addition, the recess portion is filled with the amorphous layer containing the constituent elements (Ga, In, As, Sb).

A marked position (point A) of the STEM image shown in FIG. 3B shows a measurement area in the super-lattice structure for qualitative analysis of the constituent elements by energy dispersive X-ray spectroscopy (EDX). The marked position (point A) is located in the recess portion filled with the amorphous layer. As a result of the EDX measurement, the amorphous layer in the recess portion contains gallium (Ga), indium (In), antimony (Sb), arsenic (As), silicon (Si), and oxygen (O). It is found that silicon dioxide enters the recess portion in the super-lattice structure at the interface. That is, the recess portion formed between two InAs layers contains a compound of silicon and oxygen.

Figure 4A:
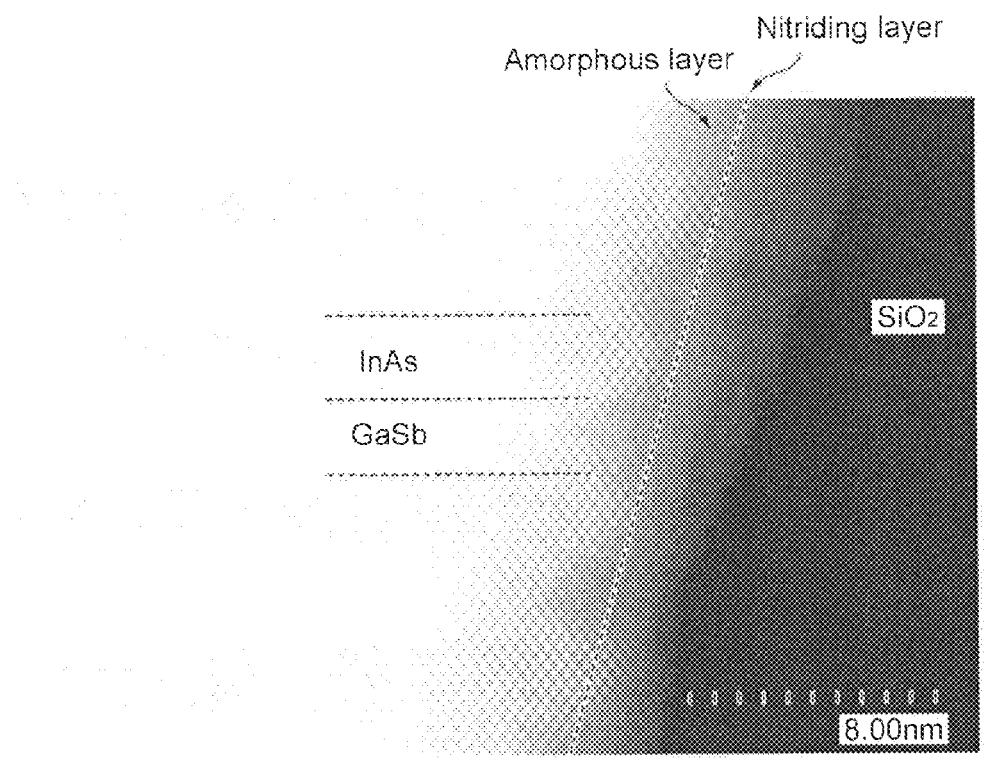
FIGS. 4A and 4B are diagrams showing scanning transmission electron microscope images in the vicinity of interfaces between a super-lattice structure in a light absorption layer, a nitriding layer, and a silicon dioxide film.
Figure 4B:
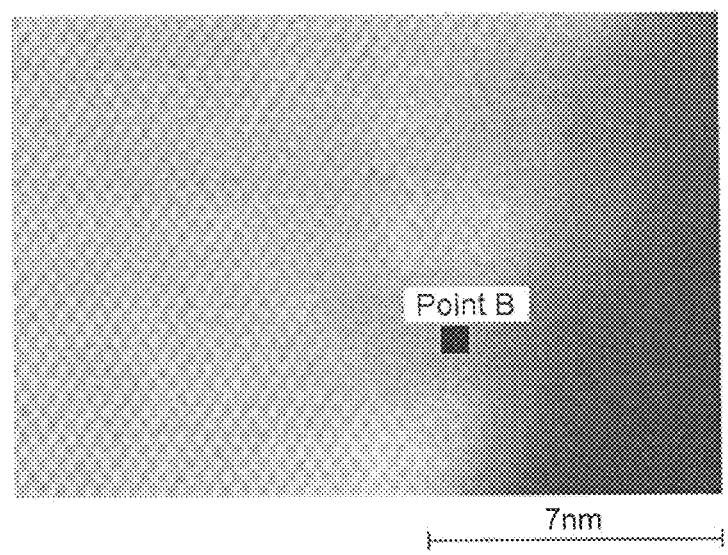

FIGS. 4A and 4B show scanning transmission electron microscope (STEM) images in the vicinity of an interface between the super-lattice structure and a silicon dioxide film for the image sensor with a nitriding layer that is disposed between the super-lattice structure and the silicon dioxide film. Referring to FIG. 4A, in the left area of the drawing, the super-lattice structure including InAs layers and GaSb layers is shown as a white background in contrast. In the right area of the drawing, the silicon dioxide layer is shown as a black background in contrast. An upward-sloping broken line from the lower edge to the upper edge indicates the nitriding layer. In this passivation structure, the nitriding layer covers the side surface of the super-lattice structure. In addition, the silicon dioxide film is disposed on the nitriding layer. In the STEM image, recess portion in which the GaSb layer is recessed relative to adjacent InAs layers from the interface toward the inside of the super-lattice structure is hardly observed. It is found that the nitriding layer improves a flatness of the side surface of the super-lattice structure.

A marked position (point B) of the STEM image shown in FIG. 4B shows a measurement area in the super-lattice structure for qualitative analysis of the constituent elements by energy dispersive X-ray spectroscopy (EDX). The marked position (point B) is located in the recess portion filled with the amorphous layer that is disposed between the nitriding layer and the super-lattice structure. According to the result of the EDX measurement, the amorphous layer in the recess portion contains gallium (Ga), indium (In), antimony (Sb), and arsenic (As), where oxygen (O) is substantially not contained. On the side surface of the super-lattice structure of the light absorption layer, the nitriding layer prevents direct contact of the super-lattice structure and the amorphous layer with the silicon dioxide film. The nitriding layer prevents that the super-lattice structure and the amorphous layer are oxidized by oxygen from the silicon dioxide film.

Figure 5A:
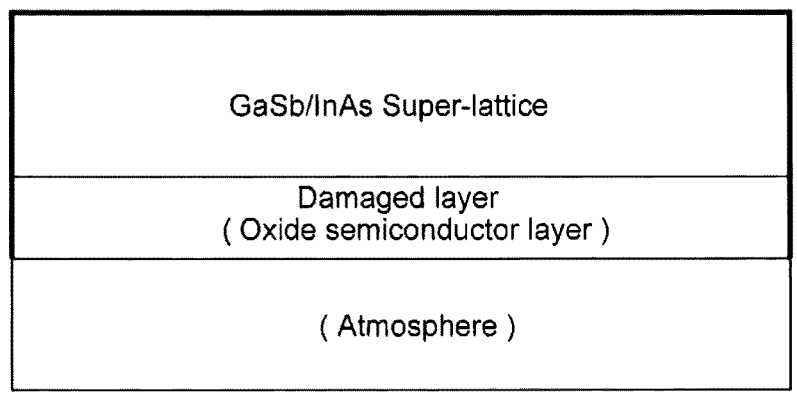
FIGS. 5A to 5C are schematic diagrams showing the vicinity of an interface between an oxide and a semiconductor in a passivation structure not including a nitriding layer but including a silicon base inorganic insulating layer.
Figure 5B:
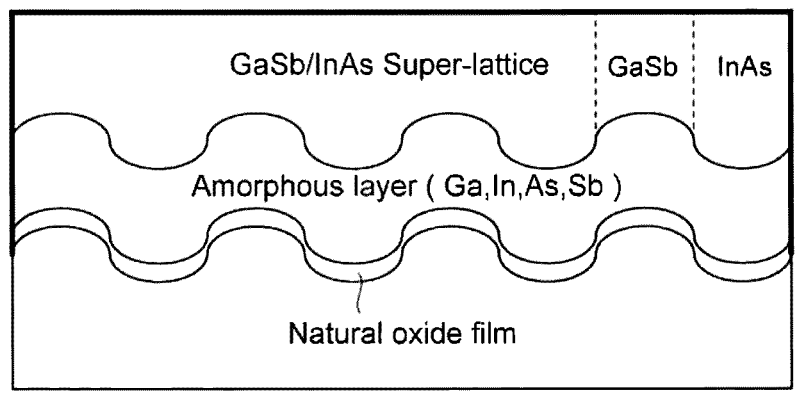
Figure 5C:
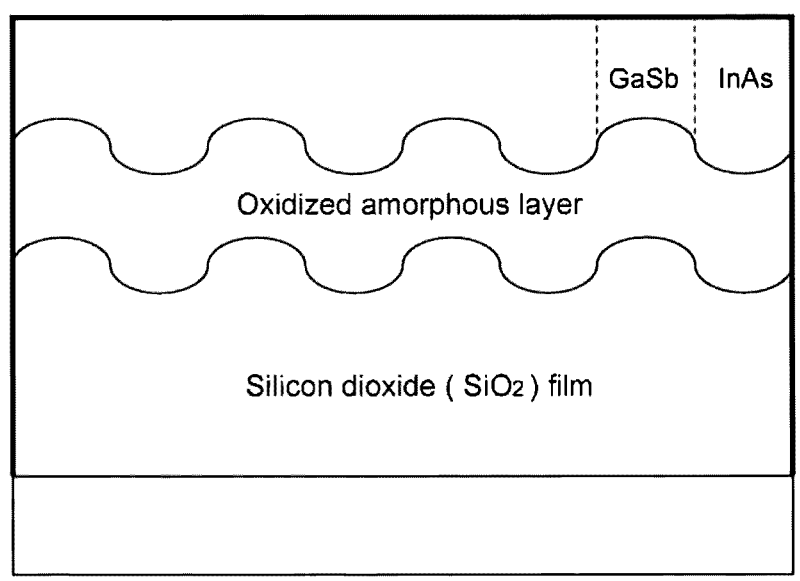

FIGS. 5A to 5C are schematic diagrams showing the vicinity of an interface between the super-lattice structure and the insulating layer in the process of forming the insulating layer on the side surface of the semiconductor mesa including the super-lattice structure as a passivation film. The passivation structure shown in FIG. 5A to 5C does not include a nitriding layer between the super-lattice structure and the insulating layer. The insulating layer includes a silicon base inorganic insulating layer such as a silicon dioxide film. As shown in FIG. 5A, after forming the semiconductor mesa by using dry etching, an oxide semiconductor layer is formed on the surface of the super-lattice structure by oxidization of the GaSb layer and the InAs layer in the super-lattice structure in the atmosphere. When a damaged layer is formed on the surface of the super-lattice structure in the dry etching process, the oxidization of the GaSb layer and the InAs layer further proceeds from the damaged layer to the super-lattice structure. As shown in FIG. 5B, when the damaged layer is removed by using a wet etching method with an etchant containing phosphoric acid, hydrogen peroxide, and water, the side surface of the super-lattice structure is covered with an amorphous layer. This amorphous layer contains constituent elements (Ga, In, As, and Sb) of the GaSb layer and the InAs layer. When the amorphous layer is brought into contact with the air, the surface of the amorphous layer is oxidized. As shown in FIG. 5C, in the process of forming the insulating layer (silicon dioxide film) on the side surface of the semiconductor mesa, an oxidizing agent gas such as $N_2O$ gas is fed into a film deposition apparatus and, thereafter, plasma is generated. When the oxidized amorphous layer is exposed to plasma (oxygen plasma) generated from an oxygen element contained in this oxidizing agent gas, oxidation of the amorphous layer further proceeds. In addition, a silicon dioxide film is formed on the oxidized amorphous layer. It is found that oxides of antimony (Sb) and Arsenic (As) cause a leakage current at the interface between the passivation film and the semiconductor layer. As a result, a dark current increases in the light receiving device.

Figure 6A:
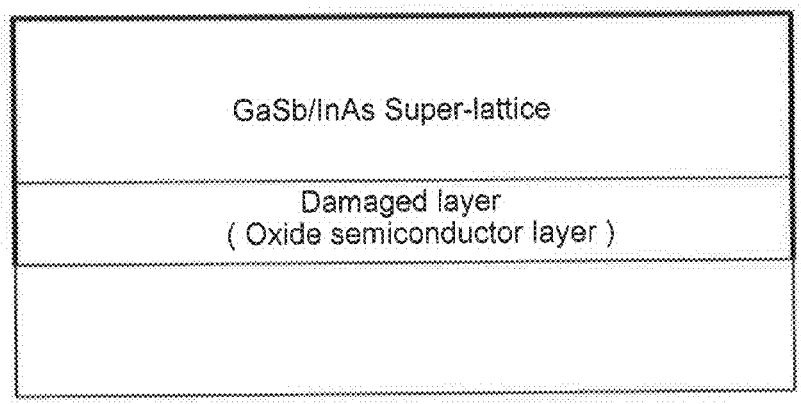
FIGS. 6A to 6C are schematic diagrams showing the vicinity of an interface between an oxide and a semiconductor in a passivation structure including both a nitriding layer and a silicon base inorganic insulating layer.
Figure 6B:
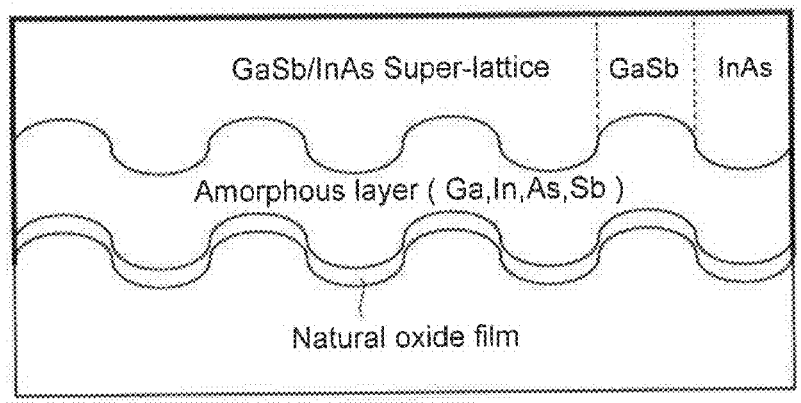
Figure 6C:
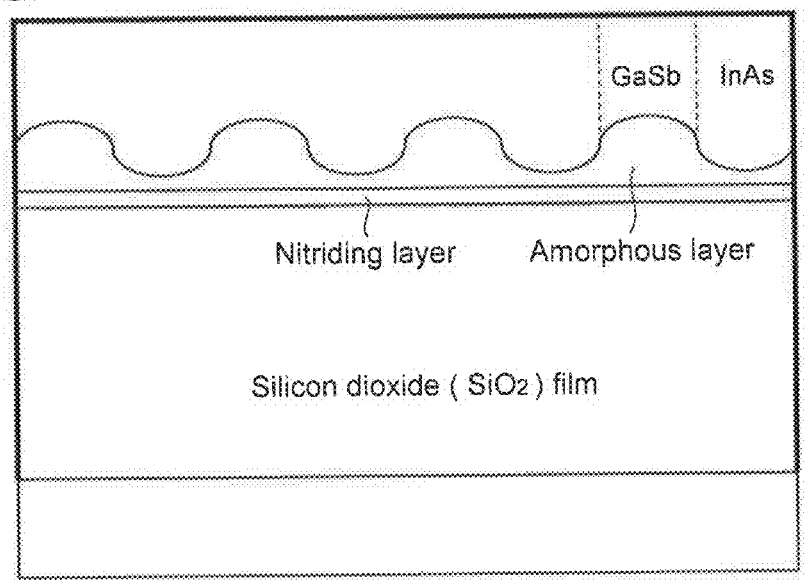

FIGS. 6A to 6C are schematic diagrams showing the vicinity of an interface between the super-lattice structure and the insulating layer in the process of forming the insulating layer on the side surface of the semiconductor mesa including the super-lattice structure as a passivation film. The passivation structure shown in FIG. 6A to 6C includes a nitriding layer between the super-lattice structure and the insulating layer. The insulating layer includes a silicon base inorganic insulating layer such as a silicon dioxide film. As shown in FIG. 6A, after forming the semiconductor mesa by using dry etching, an oxide semiconductor layer is formed on the surface of the super-lattice structure by oxidization of the GaSb layer and the InAs layer in the super-lattice structure in the atmosphere, in a similar way as the super-lattice structure shown in FIG. 5A. In FIG. 6A, a damaged layer is formed on the surface of the super-lattice structure in the dry etching process. The oxidization of the GaSb layer and the InAs layer further proceeds from the damaged layer to the super-lattice structure. As shown in FIG. 6B, when the damaged layer is removed by using a wet etching method with an etchant containing phosphoric acid, hydrogen peroxide, and water, the side surface of the super-lattice structure is covered with an amorphous layer. This amorphous layer contains constituent elements (Ga, In, As, and Sb) of the GaSb layer and the InAs layer. When the amorphous layer is brought into contact with the air, the surface of the amorphous layer is oxidized so as to form a natural oxide film. As shown in FIG. 6C, before forming the insulating layer (silicon dioxide film) on the side surface of the semiconductor mesa, the super-lattice structure is exposed to nitrogen plasma so as to form the nitriding layer. Nitrogen ions in the nitrogen plasma collide with the natural oxide film formed on the amorphous layer. Part of or entire natural oxide film is removed together with the amorphous layer by this collision. Preferably, the nitrogen plasma treatment is performed until the surface of the InAs layer in the super-lattice structure is exposed. In the nitrogen plasma treatment, group III constituent elements such as gallium (Ga) and indium (In), react simultaneously with nitrogen in the nitrogen plasma while the natural oxide film and the amorphous layer is removed. Therefore, after the nitrogen plasma treatment, nitrides having a Ga—N bond and an In—N bond are formed on the surface of the amorphous layer. As a result, the nitriding layer is formed on the amorphous layer. The nitriding layer formed on the amorphous layer functions as a barrier to oxygen from the silicon base inorganic insulating layer such as a silicon dioxide film that is formed on the nitriding layer. The nitriding layer prevents the oxidation of the amorphous layer and the super-lattice layer during forming the silicon dioxide film on the side surface of the semiconductor mesa including the super-lattice structure.

Principles of the present invention have been described on the basis of preferred embodiments with reference to the drawings. However, those skilled in the art will understand that the present invention can be changed in terms of arrangement and details without departing from such principles. The present invention is not limited to the specific configurations disclosed in the embodiments. Therefore, rights related to all modifications and changes within the scope and the spirit of the claims are claimed.

What is claimed is:

1. A light receiving device comprising:
a mesa structure including a light absorption layer disposed on a semiconductor region;
a nitriding layer disposed on a side surface of the mesa structure; and
a passivation film disposed on the nitriding layer, the passivation film containing oxygen, wherein
the light absorption layer includes a super-lattice structure including first semiconductor layers and second semiconductor layers that are alternately stacked and that are exposed at the side surface of the mesa structure,
the first semiconductor layer is made of a III-V group compound semiconductor,
the second semiconductor layer is made of a III-V group compound semiconductor that is different from the III-V group compound semiconductor of the first semiconductor layer,
the first semiconductor layer contains antimony as a group V constituent element,
the first semiconductor layers and the second semiconductor layers are in direct contact with the nitriding layer at the side surface of the mesa structure,
the nitriding layer is made of a nitride containing a group III constituent element of the first semiconductor layer and/or the second semiconductor layer.

2. The light receiving device according to claim 1, wherein the passivation film includes a silicon base inorganic insulator.

3. The light receiving device according to claim 2, wherein the silicon base inorganic insulator of the passivation film includes silicon oxide or silicon oxynitride.

4. The light receiving device according to claim 1, wherein
the semiconductor region includes a substrate made of a III-V group compound semiconductor,
the substrate has a principal surface and a back surface opposite to the principal surface,
the mesa structure is disposed on the principal surface of the substrate,
and the light absorption layer of the mesa structure is configured to receive the light incident through the back surface of the substrate.

5. The light receiving device according to claim 1, further comprising an electrode disposed on an upper surface of the mesa structure, wherein
the nitriding layer and the passivation film disposed on the side surface of the mesa structure cover the upper surface of the mesa structure,
each of the nitriding layer and the passivation film has an opening on the upper surface of the mesa structure, and
the electrode is in contact with the upper surface of the mesa structure through the openings in the nitriding layer and the passivation film.

6. The light receiving device according to claim 1, wherein
the super-lattice structure contains a GaSb/InAs super-lattice structure or a GaAsSb/GaInAs super-lattice structure, and
the nitride of the nitriding layer contains gallium and/or indium as a group III constituent element.

7. A method for manufacturing a light receiving device comprising: a mesa structure including a light absorption layer disposed on a semiconductor region; a nitriding layer disposed on a side surface of the mesa structure, and a passivation film disposed on the nitriding layer, the passivation film containing oxygen, wherein
the light absorption layer includes a super-lattice structure including first semiconductor layers and second semiconductor layers that are alternately stacked and that are exposed at the side surface of the mesa structure,
the first semiconductor layer is made of a III-V group compound semiconductor,
the second semiconductor layer is made of a III-V group compound semiconductor that is different from the III-V group compound semiconductor of the first semiconductor layer,
the first semiconductor layer contains antimony as a group V constituent element,
the first semiconductor layers and the second semiconductor layers are in direct contact with the nitriding layer at the side surface of the mesa structure, and
the nitriding layer is made of a nitride containing a group III constituent element of the first semiconductor layer and/or the second semiconductor layer,
said method comprising the steps of:
growing on a substrate, a stacked semiconductor layer including the light absorption layer including the first semiconductor layers and the second semiconductor layers of the super-lattice structure;
etching the stacked semiconductor layer to form a substrate product having the mesa structure on the substrate;
nitriding the first semiconductor layers and the second semiconductor layers exposed at the side surface of the mesa structure by irradiating a nitrogen plasma to form the nitriding layer on the side surface; and
forming the passivation film containing oxygen on the nitriding layer.

8. The method for manufacturing a light receiving device according to claim 7, wherein,
after etching the stacked semiconductor layer, the substrate product is exposed to atmosphere,
the step of nitriding the stacked semiconductor layer is performed in a film deposition apparatus, and
after the step of nitriding the stacked semiconductor layer, the passivation film is continuously formed in the film deposition apparatus.

9. The method for manufacturing a light receiving device according to claim 7, further comprising a step of etching the substrate product by using a wet etching method, after etching the stacked semiconductor layer, wherein,
in the step of etching the stacked semiconductor layer, the stacked semiconductor layer is etched by using a dry etching method so as to form a damaged region on the side surface of the mesa structure, and
in the step of etching the substrate product by using the wet etching method, the damaged region is removed.

\* \* \* \* \*